(12) United States Patent
Yano et al.

(10) Patent No.: US 6,613,482 B1
(45) Date of Patent: Sep. 2, 2003

(54) MEMBER USED FOR CHARGED BEAM PROCESSING APPARATUS, AND MASK

(75) Inventors: Hiroshi Yano, Tokyo (JP); Koji Asano, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/661,472

(22) Filed: Sep. 13, 2000

(30) Foreign Application Priority Data

Jan. 5, 2000 (JP) ........................................ 2000-005241

(51) Int. Cl.⁷ ................................................. G03F 9/00
(52) U.S. Cl. ........................................... 430/5; 430/942
(58) Field of Search ..................................... 430/5, 942

(56) References Cited

U.S. PATENT DOCUMENTS

| | | |
|---|---|---|
| 4,734,615 A | 3/1988 | Koike et al. |
| 4,737,644 A | 4/1988 | Cullum et al. |
| 5,234,781 A | 8/1993 | Sakamoto et al. ............. 430/5 |
| 5,293,045 A | 3/1994 | Miyoshi et al. |

FOREIGN PATENT DOCUMENTS

| | | |
|---|---|---|
| EP | 0999562 A2 | 11/1999 |
| JP | 4-206244 | 7/1992 |
| JP | 4-370918 | 12/1992 |
| JP | 7261375 | 10/1995 |
| JP | 7-326556 | 12/1995 |
| JP | 9251205 | 9/1997 |

Primary Examiner—Christopher G. Young
(74) Attorney, Agent, or Firm—Morrison & Foerster LLP

(57) ABSTRACT

A member adopted to be irradiated with a charged beam in an oxidizing atmosphere in a charged beam processing apparatus; comprising: a region which is to be irradiated with the charged beam, which is covered by a conductive and not oxidizable material or a material that becomes a conductive oxide when said material is oxidized.

5 Claims, 5 Drawing Sheets

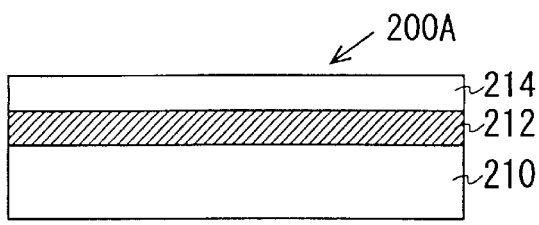
FIG. 3A
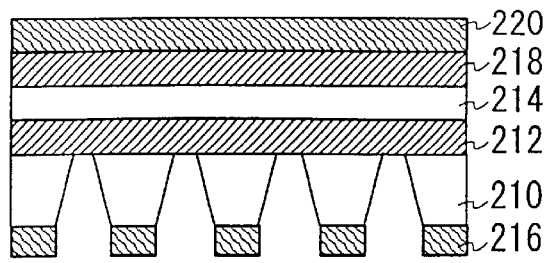
FIG. 3F
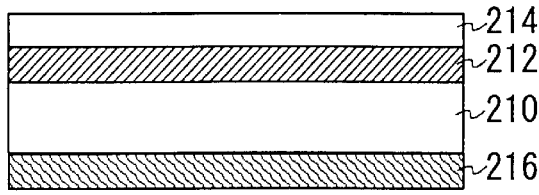
FIG. 3B
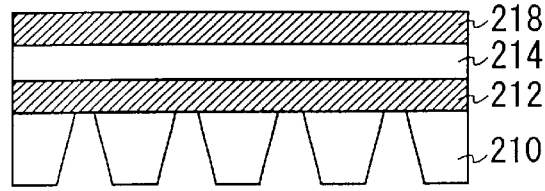
FIG. 3G
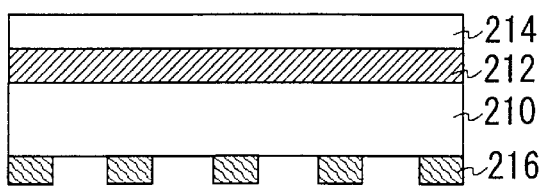
FIG. 3C
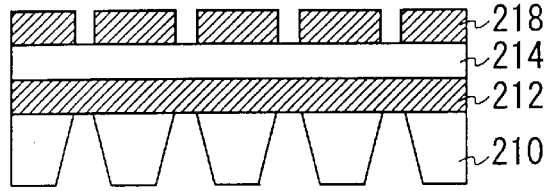
FIG. 3H
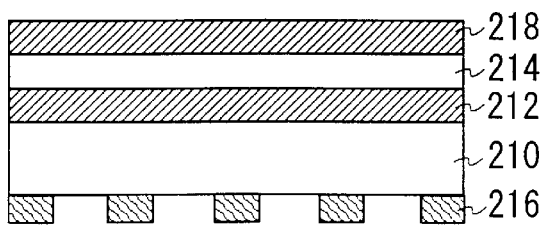
FIG. 3D
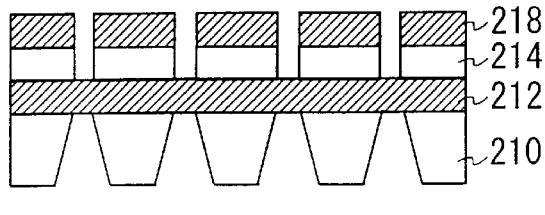
FIG. 3I
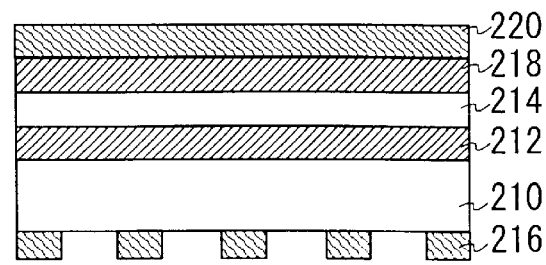
FIG. 3E
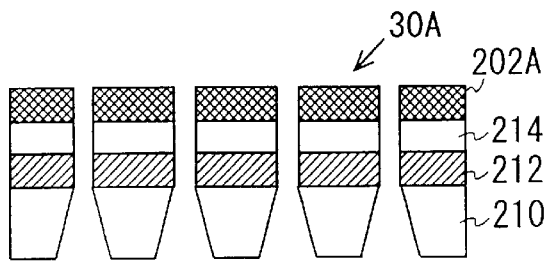
FIG. 3J
FIG. 3

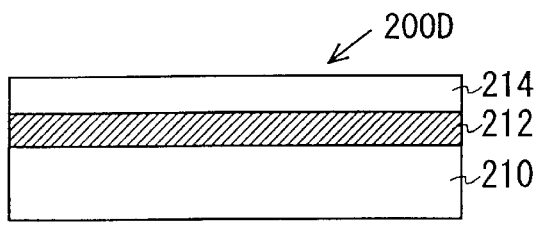
FIG. 4A
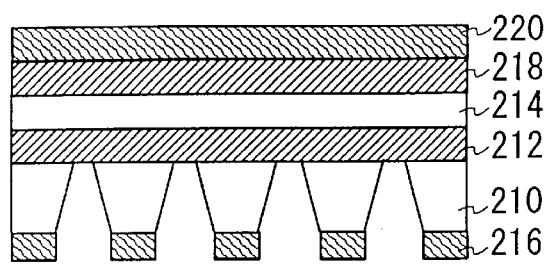
FIG. 4F
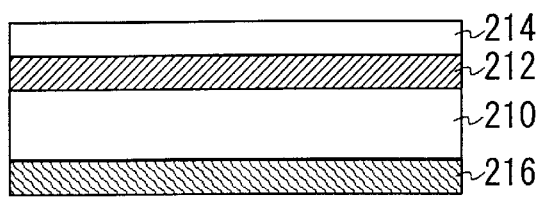
FIG. 4B
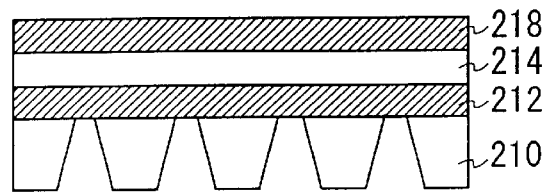
FIG. 4G
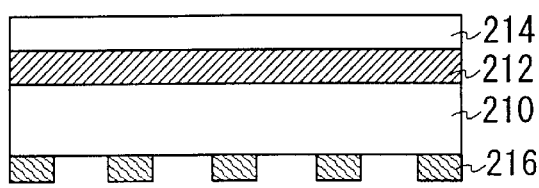
FIG. 4C
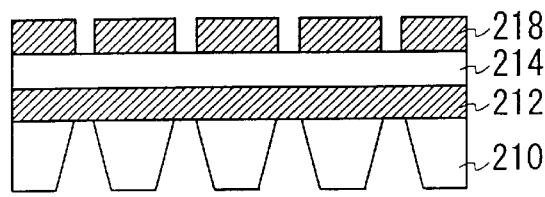
FIG. 4H
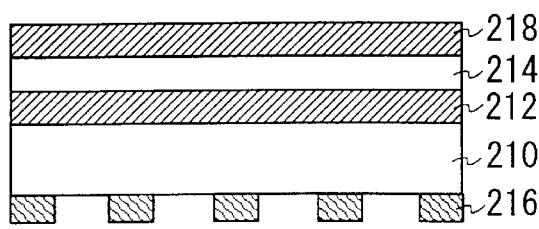
FIG. 4D
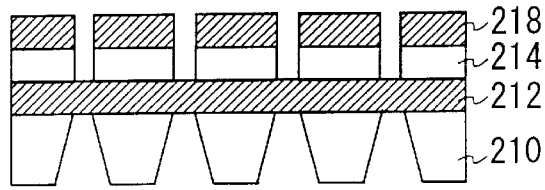
FIG. 4I
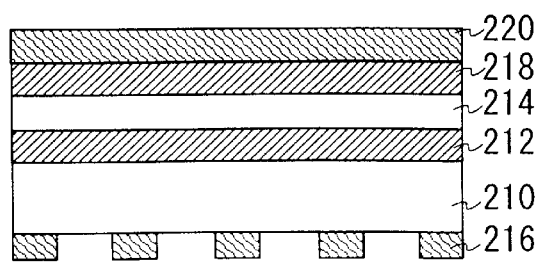
FIG. 4E
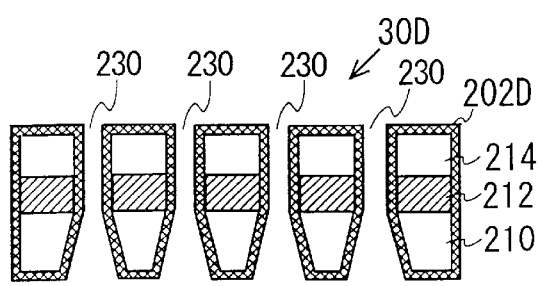
FIG. 4J
FIG. 4

MEMBER USED FOR CHARGED BEAM PROCESSING APPARATUS, AND MASK

This patent application claims priority based on a Japanese patent application, 2000-5241 filed on Jan. 5, 2000 the contents of which are incorporated herein by reference.

BACKGROUND OF THE INVENTION

1. Field of the Invention

The present invention relates to a member used for a charged beam processing apparatus such as an electron beam exposure apparatus. More particularly, the present invention relates to a member such as a mask that can prevent electrification caused by the charged beam.

2. Description of the Related Art

A mask having a plurality of blocks, on which a predetermined pattern is formed, is provided to the electron beam exposure apparatus that uses a block exposure method. During the exposure process of the electron beam exposure apparatus, the mask is irradiated by the electron beam. If the mask is charged up by the electron beam, the accuracy of the position of the pattern, which is to be exposed to the wafer, deteriorates. Therefore, for example, as disclosed in Japanese Patent Application Laid-Open No. H7-326556, the attempt is made to form a metal film made from gold, for example, on the mask surface, to prevent the mask from being charged up.

During irradiation of the electron beam in the electron beam exposure apparatus, a contaminated organic membrane is generated on the mask by carbon, for example. This contaminated organic membrane is thought to be generated by the carbon (C) existing in the vacuum attached to the substrate such as the mask. To prevent the generation of this contaminated organic membrane, performing the exposure process including performing an $O_2$ plasma cleaning or $O_3$ (ozone) cleaning, is effective.

However, because the oxidizing effect of the ozone gas and $O_2$ plasma gas is strong, the gold film formed for preventing the charge up, is oxidized. The oxidized gold film will be a cause of the electrification that deteriorates the accuracy of the position of the pattern, which is to be exposed to the wafer. Therefore, it is important not to oxidize the member, such as the mask, in the oxidizing atmosphere where the oxidizing reaction easily occurs, in order to form a high accuracy pattern on the wafer.

SUMMARY OF THE INVENTION

Therefore, it is an object of the present invention to provide a member such as a mask, which overcomes the above issues in the related art. This object is achieved by combinations described in the independent claims. The dependent claims define further advantageous and exemplary combinations of the present invention.

According to the first aspect of the present invention, a member adopted to be irradiated by a charged beam in an oxidizing atmosphere in a charged beam processing apparatus; can be provided such that the member comprises: a region, which is to be irradiated by the charged beam, which is covered by a conductive and not oxidizable material or a material that becomes a conductive oxide when the material is oxidized.

Furthermore, one material may be a carbide, boride, or nitride of a metal having a high melting point. The material may be a conductive ceramic material. The material may be a conductive oxide.

According to the second aspect of the present invention, a mask, on which a predetermined pattern is formed, adopted for a use in an electron beam exposure apparatus can be provided such that the mask comprises: a substrate, on which the predetermined pattern is formed by a material through which an electron beam does not pass; and an antioxidant layer, which is formed on a surface of the substrate by a conductive and not oxidizable material or a material that becomes a conductive oxide when the material is oxidized.

The surface may be a region, which is to be irradiated by the charged beam, of the substrate. The surface may be both upper and back faces of the surface of the substrate. The surface may be a whole surface of the substrate. The material that forms the antioxidant layer may be a carbide, boride, or nitride of a metal having a high melting point. The material that forms the antioxidant layer may be a conductive ceramic material. The material that forms the antioxidant layer may be a conductive oxide.

According to the third aspect of the present invention, an electron beam exposure apparatus which exposes a wafer in an oxidizing atmosphere to an electron beam can be provided such that the apparatus comprises: an electron gun that generates an electron beam; a plurality of members for irradiating the electron beam on a predetermined region of the wafer; and a wafer stage, on which the wafer is installed; wherein: at least a part of a region of a member, which is to be irradiated by the electron beam from among the plurality of members, is covered by a conductive and not oxidizable material or a material that becomes a conductive oxide when the material is oxidized.

According to the fourth aspect of the present invention, a method for manufacturing a semiconductor device on a wafer can be provided such that the method comprises: generating an electron beam; deflecting the electron beam to a predetermined region of a mask, a surface of which is covered by a conductive and not oxidizable material or a material that becomes a conductive oxide when the material is oxidized, in an oxidizing atmosphere; deflecting the electron beam, which passed through the mask, to a predetermined region of the wafer; and exposing the predetermined region of the wafer using the electron beam.

According to the fifth aspect of the present invention, a method for manufacturing a mask for an electron beam exposure apparatus can be provided such that the method comprises: preparing a substrate having two silicon layers that sandwich a silicon oxide film; forming a predetermined pattern on both sides of the silicon layers; and covering a surface of the substrate with a conductive and not oxidizable material or a material that becomes a conductive oxide when the material is oxidized.

The covering may cover a region, which is to be irradiated by the charged beam, of the surface of the substrate with the material. The covering may cover both upper and back faces of the surface of the substrate with the material. The covering may cover a whole surface of the substrate with the material. The covering may cover the surface of the substrate with a carbide, boride, or nitride of a metal having a high melting point. The covering may cover the surface of the substrate with a conductive ceramic material. The covering may cover the surface of the substrate with a conductive oxide.

This summary of the invention does not necessarily describe all necessary features of the present invention. The present invention may also be a sub-combination of the above described features. The above and other features and advantages of the present invention will become more apparent from the following description of embodiments taken in conjunction with the accompanying drawings.

BRIEF DESCRIPTION OF THE DRAWINGS

FIGS. 3A–3J shows a manufacturing process of a mask 30A of the present embodiment.

FIGS. 4A–4J shows a manufacturing process of a mask 30D shown in FIG. 2D of the present embodiment.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
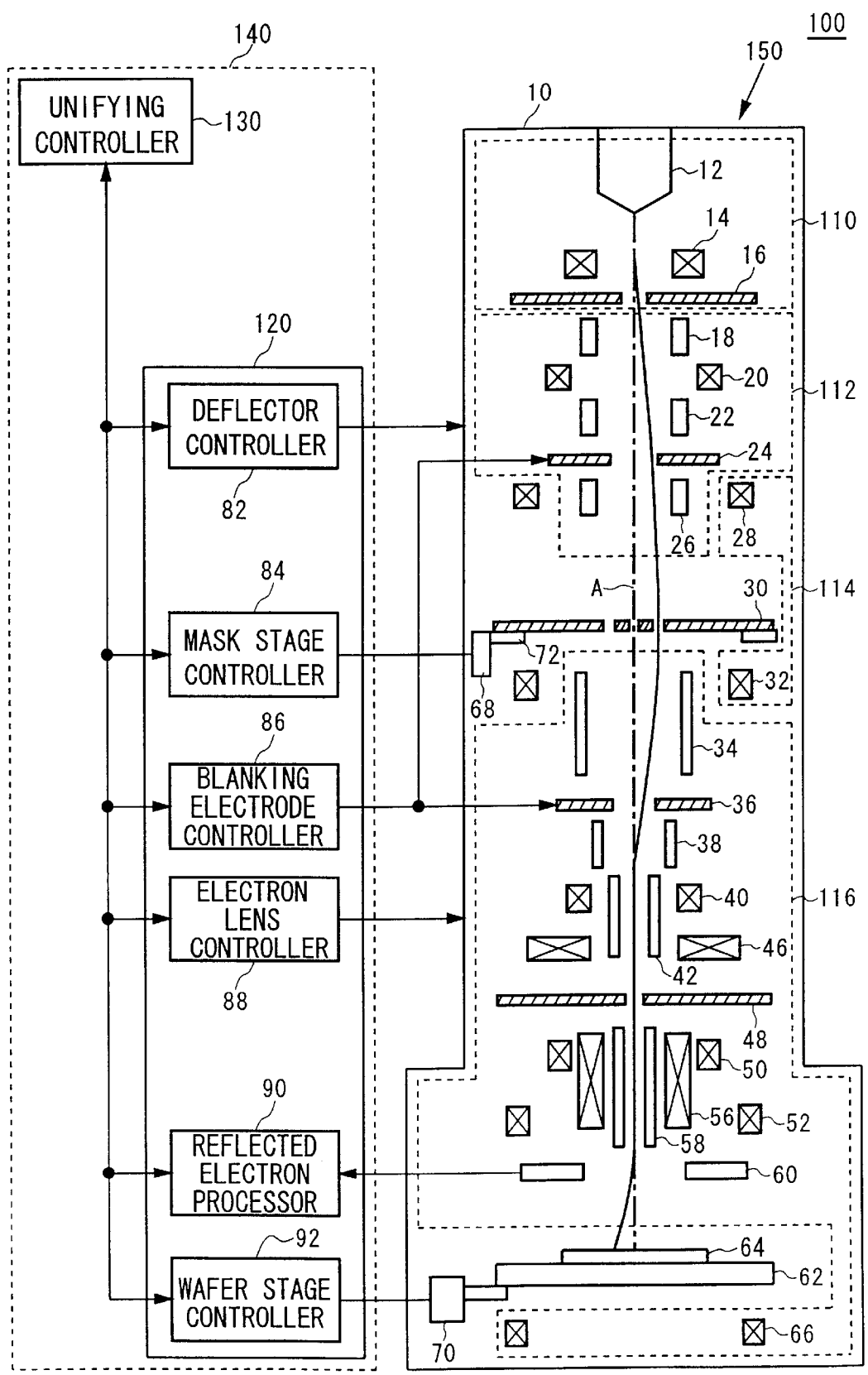
FIG. 1 shows a configuration of an electron beam exposure apparatus 100 according to an embodiment of the present invention.

FIG. 1 shows a configuration of an electron beam exposure apparatus 100 according to an embodiment of the present invention. The electron beam exposure apparatus 100 comprises an exposing unit 150 that executes a predetermined exposure process on a wafer 64 using an electron beam, and a controlling system 140 that controls the operation of each component of the exposing unit 150.

The exposing unit 150 has an electron beam irradiating system 110, a mask projection system 112, a focus adjusting lens system 114, a wafer projection system 116, and an electron optics system. The electron beam irradiating system 110 irradiates a predetermined electron beam. The mask projection system 112 deflects an electron beam, which is irradiated from an electron beam irradiating system 110, and also adjusts the imaging position of an electron beam at a periphery of a mask 30. The focus adjusting lens system 114 adjusts an imaging position of the electron beam at the periphery of the wafer 64. The electron optics system includes a wafer projection system 116 that deflects an electron beam which passes through the mask 30, to a predetermined region of the wafer 64 positioned on the wafer stage 62. The wafer projection system 116 also adjusts a direction and a size of the image of the pattern, which is to be transcribed to the wafer 64.

Furthermore, the exposing unit 150 comprises a stage system that includes a mask stage 72, a mask stage driving unit 68, a wafer stage 62, and a wafer stage driving unit 70. The mask 30 is positioned on the mask stage 72. The mask 30 has a plurality of blocks on which each of the patterns that are to be exposed to the wafer 64 are formed. The mask stage driving unit 68 drives the mask stage 72. The wafer 64, on which the pattern is exposed, is positioned on the wafer stage 62. Furthermore, the exposing unit 150 has an electron detector 60 that detects electrons scattered from the wafer stage 62 side, and converts this to an electric signal that corresponds to an amount of the scattered electrons, for adjusting the electron optics system.

The electron beam irradiating system 110 has a first electron lens 14 and a slit 16. The first electron lens 14 sets the focus position of an electron beam, which is generated at the electron gun 12. A rectangular shaped slit for the electron beam to pass through is formed on the slit 16. Because the electron gun 12 needs a predetermined time to generate a stable electron beam, the electron gun 12 may continuously generate an electron beam during an exposing process period. A slit is preferably formed in a shape which matches the shape of the block that includes a predetermined pattern formed on the mask 30. In FIG. 1, the optical axis of the electron beam, when the electron beam irradiated from the electron beam irradiating system 110 is not deflected by the electron optics system, is expressed by the broken line A.

The mask projection system 112 has a first deflector 18, a second deflector 22, a third deflector 26, a second electron lens 20, and a first blanking electrode 24. The first deflector 18, the second deflector 22, and the third deflector 26 operate as a deflecting system for a mask that deflects an electron beam. The second electron lens 20 operates as a focusing system for a mask that adjusts the focus of the electron beam. The first deflector 18 and the second deflector 22 deflect the electron beam, to irradiate the electron beam on the predetermined region of the mask 30.

For example, the predetermined region may be a block having a pattern to be transcribed into the wafer 64. The cross sectional shape of an electron beam becomes the same shape as the pattern because of the electron beam passing through the pattern. The image of the electron beam that passed through the block, on which a predetermined pattern is formed, is defined as a pattern image. The third deflector 26 deflects the orbit of the electron beam which passed through the first deflector 18 and the second deflector 22, to be approximately parallel to the optical axis A. The second electron lens 20 has a function for imaging the image of the opening of the slit 16 on the mask 30, which is provided on the mask stage 72.

The first blanking electrode 24 deflects the electron beam so that the electron beam does not hit the block formed on the mask 30. The first blanking electrode 24 preferably deflects the electron beam such that the electron beam does not hit the mask 30. Because the pattern formed on the mask 30 deteriorates as the electron beam is irradiated on the pattern formed on the mask 30, the first blanking electrode 24 deflects the electron beam at times other than when the pattern is transcribed onto the wafer 64. Therefore, the deterioration of the mask 30 can be prevented. The focus adjusting lens system 114 has a third electron lens 28 and a fourth electron lens 32. The third electron lens 28 and the fourth electron lens 32 focus the electron beam on the wafer 64.

The wafer projection system 116 has a fifth electron lens 40, a sixth electron lens 46, a seventh electron lens 50, an eighth electron lens 52, a ninth electron lens 66, a fourth deflector 34, a fifth deflector 38, a sixth deflector 42, a main deflector 56, a sub deflector 58, a second blanking deflector 36, and a round aperture 48.

The pattern image rotates due to the influence of an electric field and a magnetic field. The fifth electron lens 40 adjusts the amount of rotation of the pattern image of the electron beam, which passed through the predetermined block of the mask 30. The sixth electron lens 46 and the seventh electron lens 50 adjust a reduction ratio of the image pattern, which is transcribed onto the wafer 64, against the pattern formed on the mask 30. The eighth electron lens 52 and the ninth electron lens 66 function as an object lens.

The fourth deflector 34 and the sixth deflector 42 deflect the electron beam in the direction of the optical axis A, downstream of the mask 30, in the forward direction of the electron beam. The fifth deflector 38 deflects the electron beam such that the electron beam runs approximately parallel to the optical axis A. The main deflector 56 and the sub deflector 58 deflect the electron beam such that the electron beam irradiates at the predetermined region on the wafer 64. In the present embodiment, the main deflector 56 is used for deflecting the electron beam between the sub fields that include a plurality of shot regions, which are regions that can be irradiated with one shot of the electron beam. The sub deflector 58 is used for deflecting the electron beam between the shot regions on the sub field.

The round aperture 48 has a round aperture. The second blanking deflector 36 deflects an electron beam such that the electron beam hits the outside of the round aperture. Therefore, the second blanking deflector 36 can prevent the electron beam 20 from advancing past the round aperture 48, in the forward direction of the electron beam. Because the electron gun 12 always irradiates the electron beam during the exposing process period, the second blanking deflector 36 preferably deflects the electron beam such that the electron beam does not advance past the round aperture 48, when changing the pattern which is to be transcribed into the wafer 64, or when changing the region of the wafer 64 on which the pattern is to be exposed.

The controller system 140 comprises a unifying controller 130 and an individual controller 120. The individual controller 120 has a deflector controller 82, a mask stage controller 84, a blanking electrode controller 86, an electron lens controller 88, a reflected electron processor 90, and a wafer stage controller 92. The unifying controller 130 is, for example, a workstation that unifies and controls each of the controlling units which are included in the individual controller 120. The deflector controller 82 controls the first deflector 18, the second deflector 22, the third deflector 26, the fourth deflector 34, the fifth deflector 38, the sixth deflector 42, the main deflector 56, and the sub deflector 58. The mask stage controller 84 controls the mask stage driving unit 68 to move the mask stage 72.

The blanking electrode controller 86 controls the first blanking electrode 24 and the second blanking deflector 36. In the present embodiment, the first blanking electrode 24 and the second blanking deflector 36 are preferably to be controlled such that the electron beam is irradiated on the wafer 64 during the exposing process, and the electron beam does not reach the wafer 64 except during the exposing process. The electron lens controller 88 controls the power, which is to be provided to the first electron lens 14, the second electron lens 20, the third electron lens 28, the fourth electron lens 32, the fifth electron lens 40, the sixth electron lens 46, the seventh electron lens 50, the eighth electron lens 52, and the ninth electron lens 66. The reflected electron processor 90 detects digital data, which shows an electron quantity based on the electric signal detected by the electron detector 60. The wafer stage controller 92 moves the wafer stage 62 to a predetermined position using the wafer stage driving unit 70.

An operation of the electron beam exposure apparatus 100 according to the present embodiment will be explained. The electron beam exposure apparatus 100 performs an adjustment process, which adjusts the configuration in advance, such as the electron optics system, before performing the exposing system.

In the following, first, the adjustment process of the electron optics system before the exposing process will be explained. The wafer stage controller 92 moves the reference board, not shown in the figure, on the wafer stage 62 to the periphery of the optical axis A, using the wafer stage driving unit 70. Next, the focus position of each of the lenses is adjusted to the predetermined position. Then, the electron beam scans the marking on the reference board by the deflector. At the same time, the electron detector 60 outputs the electric signal according to the reflected electrons generated by irradiating the electron beam on the reference board.

The reflected electron processor 90 detects the reflected electron quantity and notifies this to the unifying controller 130. The unifying controller 130 judges whether the lens system is focused or not based on the detected electron quantity. The unifying controller 130 sets the power, which is to be provided to each of the electron lenses that are controlled by the electron lens controller 88, based on the focusing position when the unifying controller 130 detects the focusing position where the largest electron quantity is detected.

Next, operations of each of components of the electron beam exposure apparatus 100 during execution of the exposing process will be explained. The mask 30, which has a plurality of blocks on which a predetermined pattern is formed, is provided on the mask stage 72, and the mask 30 is fixed to the predetermined position. The exposing process can be performed in an oxidizing atmosphere such as ozone gas and $O_2$ plasma gas. At this time, the surface of the mask 30 is preferably covered by a material that does not become oxidized by, for example, ozone gas having a strong oxidizing effect. The surface of the mask 30 is also preferably covered by a material that becomes a conductive oxide when the material is oxidized. Furthermore, the wafer 64, on which an exposing process is performed, is provided on the wafer stage 62.

The wafer stage controller 92 moves the wafer stage 62 by the wafer stage driving unit 70, to locate the region of the wafer 64 which is to be exposed, at the periphery of the optical axis A. Moreover, because the electron gun 12 always irradiates the electron beam during the exposing process period, the blanking electrode controller 86 controls the first blanking electrode 24 and the second blanking deflector 36 such that the electron beam which passed through the opening of the slit 16, does not become irradiated to the mask 30 and the wafer 64.

In the mask projection system 112, the second electron lens 20 and the deflectors 18, 22, and 26 are adjusted such that the deflectors 18, 22, and 26 can deflect the electron beam to be irradiated on the block on which the pattern to be transcribed to the wafer 64 is formed. In the focus adjusting lens system 114, the electron lenses 28 and 32 are adjusted such that the electron beam is focused to the wafer 64. Moreover, in the wafer projection system 116, the electron lenses 40, 46, 50, 52, and 66, and the deflectors 34, 38, 42, 56, and 58 are adjusted such that the pattern image can be transcribed to the predetermined region of the wafer 64.

After adjusting the mask projection system 112, the focus adjusting lens system 114, and the wafer projection system 116, the blanking electrode controller 86 stops the deflection of the electron beam by the first blanking electrode 24 and the second blanking deflector 36. Thereby, the electron beam is irradiated to the wafer 64 through the mask 30. The electron gun 12 generates an electron beam, and the first electron lens 14 adjusts the focus position of the electron beam, to irradiate the electron beam to the slit 16. Then, the first deflector 18 and the second deflector 22 deflect the electron beam, which passed through the opening of the slit 16, to irradiate the electron beam to the predetermined region of the mask 30, on which the pattern to be transcribed is formed.

The electron beam, which passed through the opening of the slit 16, has a rectangular cross section. The electron beam, which is deflected by the first deflector 18 and the second deflector 22, is deflected to be approximately parallel to the optical axis A by the third deflector 26. Moreover, the electron beam is adjusted such that the image of the opening of the slit 16 is imaged at the predetermined region on the mask 30 by the second electron lens 20.

Then, the electron beam that passed through the pattern, which is formed on the mask 30, is deflected to the direction close to the optical axis A by the fourth deflector 34 and the sixth deflector 42, and the electron beam is deflected to be approximately parallel to the optical axis A by the fifth deflector 38. Moreover, the electron beam is adjusted such that the image of the pattern which is formed on the mask 30, is focused on the surface of the wafer 64 by the third electron lens 28 and the fourth electron lens 32. The rotation amount of the electron beam is adjusted by the fifth electron lens 40, and the ratio of reduction of the pattern image is adjusted by the sixth electron lens 46 and the seventh electron lens 50.

Then, the electron beam is deflected, and is irradiated to the predetermined shot region on the wafer 64 by the main deflector 56 and the sub deflector 58. In the present embodiment, the main deflector 56 deflects the electron beam between the sub fields that include a plurality of shot regions. The sub deflector 58 deflects the electron beam between the shot regions in the sub field. The electron beam deflected to the predetermined shot region is adjusted by the eighth electron lens 52 and the ninth electron lens 66 and is irradiated to the wafer 64. Thereby, the pattern image formed on the mask 30 is transcribed onto the predetermined shot region on the wafer 64.

After the predetermined exposure period has elapsed, the blanking electrode controller 86 controls the first blanking electrode 24 and the second blanking deflector 36 to deflect the electron beam, so that the electron beam does not irradiate the mask 30 and the wafer 64. The above-mentioned process exposes the pattern formed on the mask 30 exposed on the predetermined shot region on the wafer 64.

To expose the pattern which is formed on the mask 30 to the next shot region, in the mask projection system 112, the second electron lens 20 and the deflectors 18, 22, and 26 are adjusted such that the deflectors 18, 22, and 26 can deflect the electron beam to be irradiated on the block on which the pattern to be transcribed to the wafer 64 is formed. In the focus adjusting lens system 114, the electron lenses 28 and 32 are adjusted such that the electron beam is focused to the wafer 64. Moreover, in the wafer projection system 116, the electron lenses 40, 46, 50, 52, and 66, and the deflectors 34, 38, 42, 56, and 58 are adjusted such that the pattern image can be transcribed to the predetermined region of the wafer 64.

Specifically, the sub deflector 58 adjusts the electric field such that the pattern image generated by the mask projection system 112 is exposed to the next shot region. Then, the pattern is exposed to the shot region as shown above. After exposing the pattern to the entire shot region on which the pattern inside the sub field is to be exposed, the main deflector 56 adjusts the magnetic field such that the pattern can be exposed to the next sub field. The electron beam exposure apparatus 100 can expose the desired circuit pattern on the wafer 64 by repeatedly performing the above-mentioned exposing process.

FIG. 2A to FIG. 2D show an embodiment of a mask 30 of the present invention. In FIGS. 2A–2D, the mask 30A–30D of the present embodiment has a substrate 200A–200D and an antioxidant layer 202A–200D, respectively. The substrate 200A–200D is made from a material that does not pass through the electron beam.

Figure 2A:
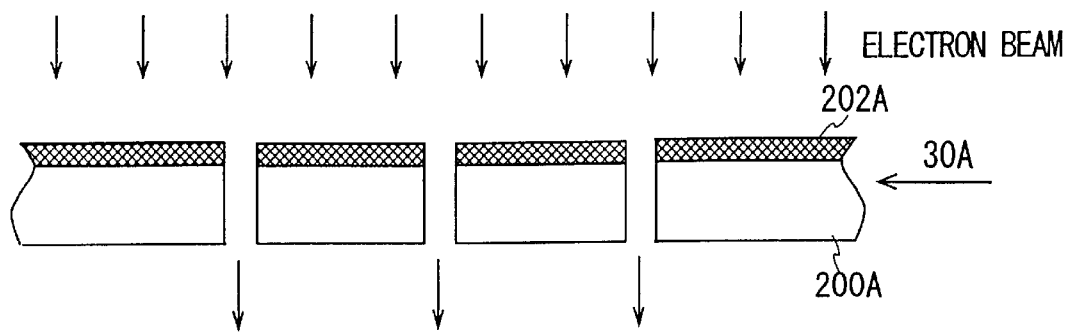
FIG. 2A to FIG. 2D shows an embodiment of a mask 30 of the present invention.
Figure 2B:
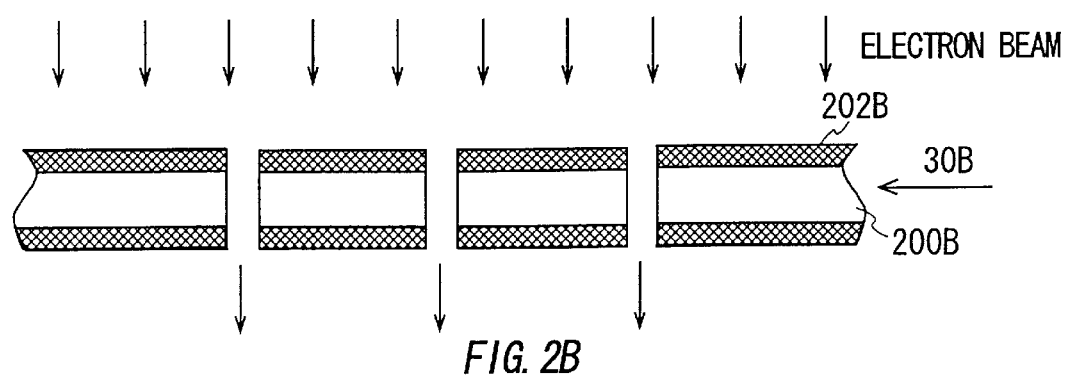
Figure 2C:
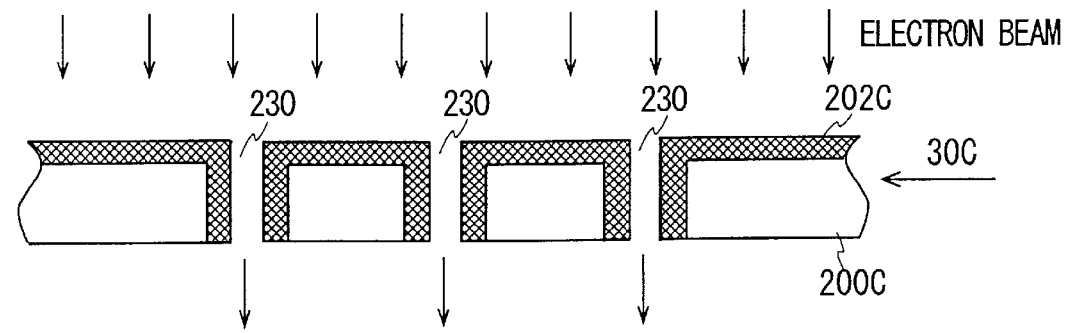
Figure 2D:
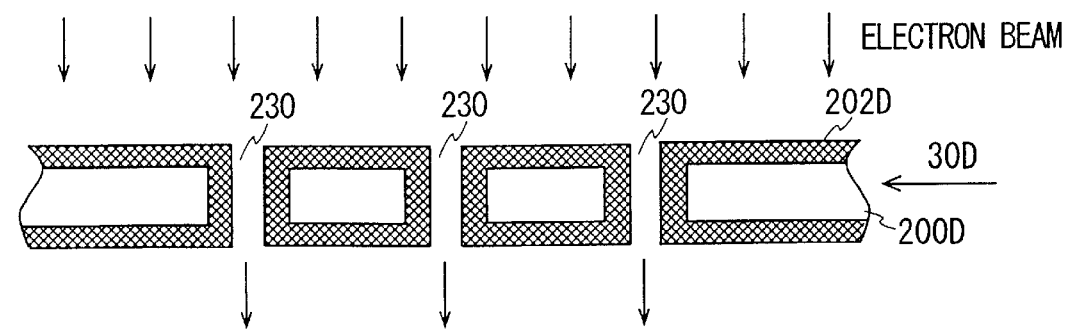

In FIG. 2A, the antioxidant layer 202A is formed on the upper surface of the substrate 200A. The antioxidant layer is preferably formed at least on the surface of the substrate on which the electron beam is irradiated. Furthermore, as shown in FIG. 2B, the antioxidant layer 202B may be further provided on the back face of the substrate 200B. Also, as shown in FIG. 2C, the antioxidant layer 202C may also be provided on the side face of the through hole 230, which is formed when forming the pattern on the mask 30C. Furthermore, as shown in FIG. 2D, the antioxidant layer 202D may also be provided on the whole surface of the mask 30D including the side face of the through holes 230.

The substrate 200A–200D is preferably formed from a material which can be processed microscopically, using a semiconductor manufacturing process such as plasma etching. For example, the material that forms the substrate 200A–200D may be silicon, silicon carbide, or a metal having a high melting point, and the carbide, the boride, and the nitride of a metal having a high melting point. For example, the carbide of the metal having a high melting point includes TaC, the boride of the metal having a high melting point includes $TaB_2$, and the nitride of the metal having a high melting point includes TaN.

The antioxidant layer 202A–202D is preferably made from a conductive and not oxidizable material or a material that becomes a conductive oxide when the material is oxidized. Specifically, the antioxidant layer 202A–202D is preferably made from a material that is more difficult to oxidize than gold, which is used conventionally. For example, the material that forms the antioxidant layer 202A–202D may be, for example, platinum (Pt), rhodium (Rh), a carbide, boride, and nitride of a metal having a high melting point, conductive ceramic, and conductive oxide. For example, the conductive ceramic includes SiC, and the conductive oxide includes $RuO_2$, $ReO_2$, and ITO film. As a material that becomes a conductive oxide when the material is oxidized, there is a ruthenium (Ru). The ruthenium (Ru) becomes conductive oxide $RuO_2$ when it is oxidized in the electron beam exposure apparatus 100.

In the present embodiment, the mask 30A–30D has a substrate 200A–200D, on which a predetermined pattern is formed, and an antioxidant layer 202A–202D, which covers the surface of the substrate 200A–200D, respectively. In another embodiment, the substrate 200A–200D itself may be formed from a material that can function as a substrate 200A–200D and also as an antioxidant layer 202A–202D. That is, by forming the substrate 200A–200D from a material that is not oxidizable, the substrate 200A–200D itself may have an electrification preventing function.

In the present embodiment, the antioxidant layer 202A–202D is formed on the mask 30A–30D, on which an electron beam that is a charged beam is irradiated. However, as another embodiment, the antioxidant layer 202A–202D is preferably formed on the other members on which an electron beam is to be irradiated. By covering the region on which the electron beam is to be irradiated, with the conductive and not oxidizable material or a material that becomes a conductive oxide when the material is oxidized, the region is not oxidized, even in an oxidizing atmosphere such as an ozone atmosphere or $O_2$ plasma, and the members thereby do not become charged up. With reference to FIG. 1, the antioxidant layer which does not become oxidized, is preferably formed on the surface of the members other than the mask 30, such as the slit 16, the round aperture 48, the sub deflector 58, and the wafer stage 62 in the electron beam exposure apparatus 100.

FIGS. 3A–3J show a manufacturing process of a mask 30A of the present embodiment. First, the substrate 200A, which is a wafer having a $SiO_2$ film in the middle, is prepared. FIG. 3A shows a wafer having a Si layer 210, a middle $SiO_2$ film 212, and a Si layer 214. In one of the embodiments, the Si layer 210 has a layer thickness of 650 $\mu$m, the middle $SiO_2$ film 212 is 10 $\mu$m, and the Si layer 214 has a layer thickness of 20 $\mu$m.

Next, as shown in FIG. 3B, a SiN layer 216 is grown on the surface of the Si layer 210. The SiN layer 216 is formed to have a thickness of 0.7 $\mu$m, then, as shown in FIG. 3C, an opening pattern used for anisotropic etching is formed on the SiN layer 216. As shown in FIG. 3D, a $SiO_2$ film 218, the thickness of which is 1 $\mu$m, is formed on the surface of the Si layer 214. Next, as shown in FIG. 3E, a SiN film 220, the thickness of which is 0.7 $\mu$m, is formed on the surface of the $SiO_2$ layer 218. The SiN layer 220 protects the $SiO_2$ layer 218 so that the $SiO_2$ layer 218 does not become etched in the following anisotropic etching process.

Next, the Si layer 210 is etched anisotropically. KOH is used as an etching material. As shown in FIG. 3F, by performing the anisotropic etching, the Si layer 210 becomes a membrane. The upper face of the substrate 200 is protected by the SiN layer 220, thereby not becoming etched. Next, as shown in FIG. 3G, the SiN layers 216 and 220 are removed. Then, as shown in FIG. 3H, a predetermined pattern is formed on the $SiO_2$ film 218. When the mask 30A is used for an electron beam exposure apparatus 100, which performs the block exposure, a plurality of predetermined patterns are formed on the $SiO_2$ film 218.

Next, as shown in FIG. 3I, the Si layer 214 is trench etched from the upper face of the wafer, and a trench part of the predetermined pattern is formed on the Si layer 214. Then, the $SiO_2$ film 218 and a part of the middle $SiO_2$ film 212 are removed.

At least part of the region of the middle $SiO_2$ film 212 is preferably removed so that the trench part is bored through the substrate 200A. Next, as shown in FIG. 3J, the antioxidant layer 202A is formed on the upper surface of the Si layer 214. The above-mentioned process can form the mask 30A having an antioxidant layer 202A.

In the above, the example is made of using the antioxidant layer 202 as a member of the electron beam exposure apparatus 100 that performs the block exposure. However, the antioxidant layer 202 can be used as a member of the electron beam exposure apparatus that uses another exposing method. For example, in the electron beam exposure apparatus using a blanking aperture array (BAA) device, the antioxidant layer 202 can be formed on the surface of the blanking aperture array device. Furthermore, also in another electron beam processing apparatus such as an electron beam tester or an electron microscope, the antioxidant layer 202 may be formed on the member that is to be irradiated with an electron beam.

FIGS. 4A–4J shows a manufacturing process of a mask 30D shown in FIG. 2D of the present embodiment. The same procedure as shown from FIG. 3A to FIG. 3I is performed in the manufacturing process of FIG. 4. The difference between the manufacturing process of FIG. 3 and FIG. 4 is the process after performing the process shown in FIG. 3I. In FIG. 3I, after removing the $SiO_2$ film 218 and a part of the middle $SiO_2$ film 212, the antioxidant layer 202A is formed on the upper surface of the Si layer 214. In FIG. 4I, after removing the $SiO_2$ film 218 and a part of the middle $SiO_2$ film 212, the antioxidant layer 202D is formed on the whole surface of the Si layer 214 including the side faces of the through holes 230. By forming the antioxidant layer 202D on the whole surface of the mask 30D, the mask 30D having an antioxidant layer 202D can be formed. Similarly, by forming the antioxidant layer 202B on both upper and back faces of the Si layer 214, the mask 30B having an antioxidant layer 202B can be formed. Furthermore, by forming the antioxidant layer 202C on the upper face of the Si layer 214 and the side face of the through holes 230, the mask 30C having an antioxidant layer 202C can be formed.

Figure 5:
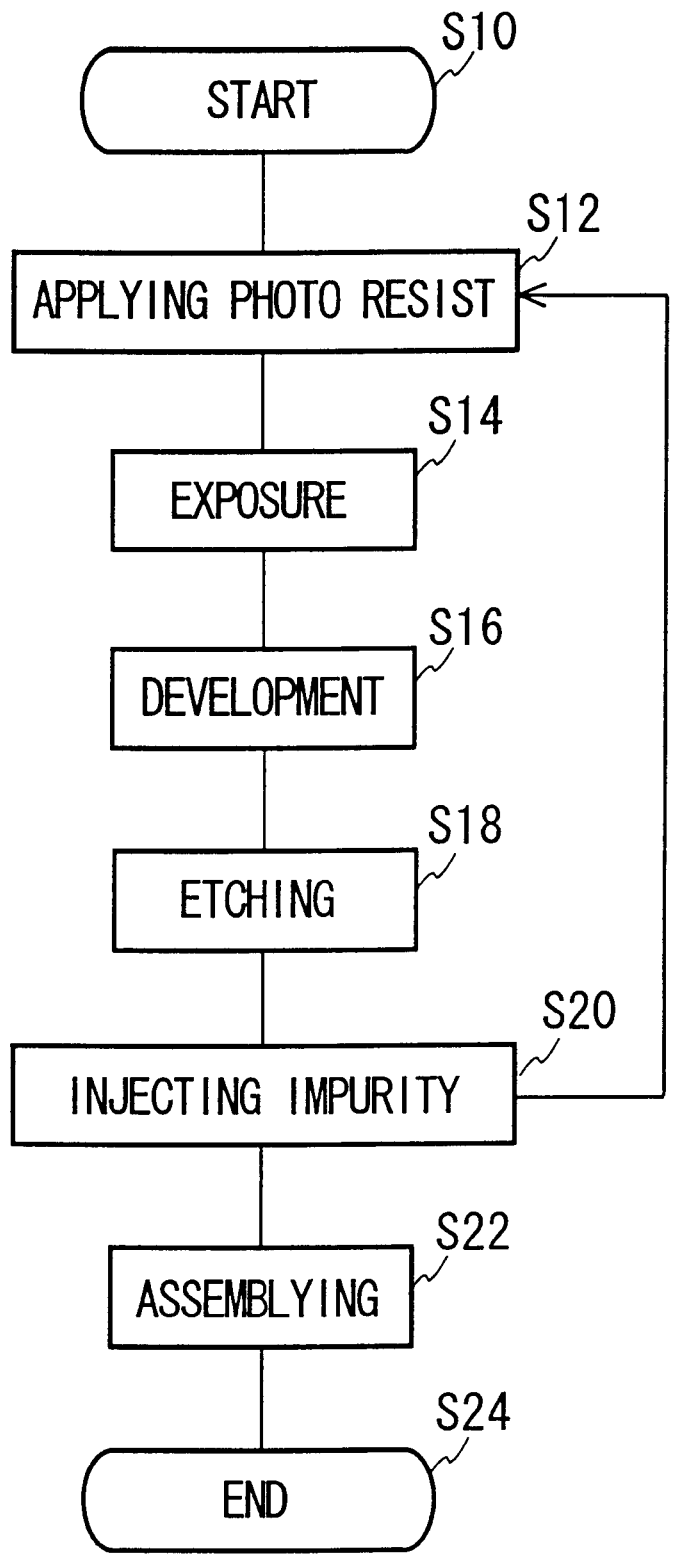
FIG. 5 shows a flow chart of semiconductor manufacturing process for manufacturing a semiconductor device from a wafer.

FIG. 5 shows a flow chart of a semiconductor manufacturing process for manufacturing a semiconductor device from a wafer. This flow chart shown in FIG. 5 starts from the step S10. A photo resist is applied on the upper surface of the wafer at the step S12. Next, the wafer 64, on which the photo resist is applied, is placed on the wafer stage 62 in the electron beam exposure apparatus 100 shown in FIG. 1. The mask 30, the surface of which is covered by the conductive and not oxidizable material, is installed on the mask stage 72. An oxidizing atmosphere such as ozone gas or $O_2$ plasma gas exists around the periphery of the mask 30. As explained with reference to FIG. 1, the wafer 64 is exposed, and the electron beam that has passed through the mask 30 transcribes the pattern image onto the wafer 64.

Next, in step S16, the wafer 64, which is exposed, is soaked in a developer to be developed, and any extra resist is removed. Next, in the step S18, the oxidized film or nitride film existing in the region where the photo resist on the wafer was removed is etched by the etching liquid. Next, in the step S20, impurities such as phosphorus or arsenic are injected into the wafer to form a semiconductor device such as a transistor or diode. By repeatedly performing the process from the step S12 to the step S20, it is possible to manufacture a semiconductor device having a plurality of layers of patterns on the wafer. In the step S22, the wafer, on which a predetermined circuit is formed, is cut off and the chip is then assembled The semiconductor device manufacturing flow ends at the step S24.

As shown above, according to the present invention, the charge up, which occurs in the members in the charged beam processing apparatus, can be prevented.

Although the present invention has been described by way of exemplary embodiments, it should be understood that many changes and substitutions may be made by those skilled in the art without departing from the spirit and the scope of the present invention which is defined only by the appended claims.

What is claimed is:

1. A member adopted to be irradiated by a charged beam in an oxidizing atmosphere in a charged beam processing apparatus, comprising:

a first surface exposed to the charged beam when irradiated; and a second surface opposite to said first surface, said first surface and said second surface covered by a conductive and not oxidizable material or a material that becomes a conductive oxide when said material is oxidized.

2. A member as claimed in claim 1, wherein said material is a carbide, boride, or nitride of a metal having a high melting point.

3. A member as claimed in claim 1, wherein said material is a conductive ceramic material.

4. A member as claimed in claim 1, wherein said material is a conductive oxide.

5. A member as claimed in claim 1, further comprising:

a third surface connecting said first surface and said second surface, said third surface being covered by the same material as covered on said first surface or said second surface.

* * * * *